(12) United States Patent
Heide

(10) Patent No.: US 6,775,183 B2
(45) Date of Patent: Aug. 10, 2004

(54) MAGNETIC MEMORY DEVICE EMPLOYING GIANT MAGNETORESISTANCE EFFECT

(75) Inventor: Carsten Heide, Berlin (DE)

(73) Assignee: BTG International Ltd., London (GB)

( * ) Notice: Subject to any disclaimer, the term of this patent is extended or adjusted under 35 U.S.C. 154(b) by 0 days.

(21) Appl. No.: 10/278,008

(22) Filed: Oct. 22, 2002

(65) Prior Publication Data
US 2004/0076036 A1 Apr. 22, 2004

(51) Int. Cl.[7] .............................................. G11C 11/00
(52) U.S. Cl. ...................... 365/173; 365/158; 365/171
(58) Field of Search ................................. 365/173, 171, 365/158, 232, 66, 74

(56) References Cited

U.S. PATENT DOCUMENTS

| | | | |
|---|---|---|---|
| 5,341,118 A | 8/1994 | Parkin | |
| 5,343,422 A | 8/1994 | Kung | |
| 5,573,809 A | 11/1996 | Nix | |
| 6,072,718 A | 6/2000 | Abraham | |
| 6,174,737 B1 | 1/2001 | Durlam | |
| 6,269,018 B1 | 7/2001 | Monsma | |
| 6,331,944 B1 | 12/2001 | Monsma | |
| 6,404,673 B1 * | 6/2002 | Matsui | ........................ 365/173 |
| 6,519,122 B1 * | 2/2003 | Kakihara | ................ 360/324.12 |
| 2002/0055190 A1 | 5/2002 | Anthony | |

FOREIGN PATENT DOCUMENTS

GB  2 343 308 A  5/2000

OTHER PUBLICATIONS

Grollier, et al., "Spin–polarized current induced switching in Co/Cu/Co pillars," Applied Phyiscs Letters, American Inst. of Physics, vol. 78, (No. 23), p. 3663–3665, (Dec. 12, 2001).

* cited by examiner

Primary Examiner—Gene N. Auduong
(74) Attorney, Agent, or Firm—Hahn Loeser & Parks LLP

(57) ABSTRACT

A magnetic memory cell has a first conductive layer or a first stack of two or more conductive layers having at least one first magnetic layer with a first magnetic moment, a second conductive layer or a second stack of two or more conductive layers having least one second magnetic layer with a second magnetic moment, and a third non-magnetic layer or a third stack of two or more non-magnetic layers, that is arranged between and contacting said first layer or stack and said second layer or stack and allows a non-tunneling current to pass. Furthermore, the magnetic memory cell comprises a current control element allowing a current of up to at least a predetermined writing current amount to pass across the cell in a first direction perpendicular to the layer planes, and prohibiting a current to pass across the cell in a second direction opposite to said first direction, unless the current amount in the second direction is higher than a predetermined reading current amount, which reading current amount is lower than said writing amount. The extensions of said layers or stacks in a direction perpendicular to the layer planes, as well as the materials of said layers or stacks are adapted to allow a change of an orientation of said first and second magnetic moments relative to each other with the aid of a current of at least said writing current amount, and to influence a current amount across the cell of at most said reading current amount by a giant magnetoresistance effect.

32 Claims, 11 Drawing Sheets

MAGNETIC MEMORY DEVICE EMPLOYING GIANT MAGNETORESISTANCE EFFECT

The invention relates to a magnetic memory cell, a magnetic memory comprising an inventive magnetic memory cell, a memory circuit for writing a magnetic memory cell, and a method of writing a magnetic memory cell.

BACKGROUND OF THE ART

Magnetic random access memories (MRAMs) have been proposed due to their non-volatile nature. Unlike dynamic random access memory (DRAM) cells, non-volatile memory cells such as MRAM cells do not require complex circuitry for perpetual electronic refreshing of the stored information.

The first of such MRAMs were based on magnetic multi-layer structures, deposited on a substrate. U.S. Pat. No. 5,343,422, for example, discloses a structure in which two layers of ferromagnetic material are separated by a layer of non-magnetic metallic conducting material. One of the magnetic materials, called the ferromagnetic fixed layer (FMF), has a fixed direction of magnetic moment, e,g., by having a particularly high coercive field or strong unidirectional anisotropy. The other magnetic layer, called the ferromagnetic soft layer (FMS), has a preferred axis for the direction of magnetisation, the so called easy-axis, which is aligned parallel to the magnetic moment of the ferromagnetic fixed layer, The magnetic moment of this ferromagnetic soft layer is free to change direction between parallel and anti-parallel alignment relative to the easy-axis, and as a consequence, also relative to the magnetic moment of the ferromagnetic fixed layer on application of an external magnetic field.

The state of the storage element represents a logical "1" or "0" depending on whether the directions of the magnetic moments of the magnetic layers are in parallel or anti-parallel alignment, respectively. Because the resistance of the storage element is different for different mutual orientations of the magnetic moments, the structure acts as a spin valve. It thus allows the sensing of the state of the storage element by measuring the differential resistance $\Delta R/R$ with a current, where $\Delta R$ is the difference in resistance of the storage element for two different states of relative orientation of the magnetic moments, and R is the total resistance of the structure in the lower resistance state.

A switching between these orientations can be achieved by passing write currents in the vicinity of the FMS, usually by using write lines which run past the layered structure on either side. These write currents, which do not pass through the layered structure itself, induce a magnetic field at the location of the FMS which alters the orientation of the FMS, if it is stronger than the coercive field $H_c$ of the FMS.

An alternative is disclosed in U.S. Pat. No. 6,072,718. There, the conducting nonmagnetic spacer layer between the two magnetic layers is replaced by an insulator. The device therefore forms a magnetic tunnel junction (MTJ), where spin polarised electrons tunnel through the insulator.

The cell disclosed in U.S. Pat. No. 6,072,718 is written by simultaneously sending a current through the word and bit line crossing at the location of the cell. Each of these currents causes a magnetic field at the location of the memory cell. As the word lines and the bit lines are perpendicular to each other, the orientations of the magnetic fields caused by the currents at a crossing point of a bit line and a word line are perpendicular, too. One of the two magnetic fields, the so called hard-axis field, extends parallel to the magnetic hard-axis of the ferromagnetic soft layer, while the other one of the magnetic fields, the so called easy-axis field, extends parallel to the magnetic easy-axis of the ferromagnetic soft layer.

In a write process, usually the hard-axis field, which is perpendicular to the magnetic moment of the ferromagnetic soft layer, is applied to the ferromagnetic soft layer in order to move the magnetic moment out of its actual orientation and the easy-axis field is used to set the new orientation of the magnetic moment with respect to the easy-axis of the ferromagnetic soft layer.

During a write process, all memory cells arranged in a first line will experience the same hard-axis field while all memory cells arranged in a second line perpendicular to the first line will experience the same easy-axis field. The strength of both magnetic fields must be chosen such that one of both fields alone is not able to switch a memory cell. Therefore, in an ideal memory array (i.e. all memory cells of the array show the same magnetic response to an applied magnetic field), only the memory cell which is located at the crossing of both lines experiences the hard-axis field as well as the easy-axis field and is therefore written. In contrast to the ferromagnetic soft layer, the ferromagnetic fixed layer has a coercivity that is high enough such that its magnetic moment is left unchanged in this process.

However, in an actual memory cell array, due to many factors related to manufacturing uncertainties and intrinsic magnetic variability, variations in the magnetic response throughout the memory cells in a memory cell array can be very large. Due to these variations, some of the memory cells may be written inadvertently if only one of the magnetic hard-axis field and the magnetic easy-axis field is applied. As a consequence, an array-wide selectivity of the writing process is generally not achieved. The response variations are, e.g., caused by tolerances during the manufacturing process, which for example may lead to differences in the surface roughness of different cells, having a consequent influence on the magnetic response of the cell.

In GB 2 343 308, a magnetic storage device is disclosed, which comprises a first and a second ferromagnetic layer and a tunnel barrier which is disposed between both ferromagnetic layers. The first ferromagnetic layer is a ferromagnetic fixed layer whereas the second ferromagnetic layer is a ferromagnetic soft layer which can change the orientation of its magnetic moment. The device can be written directly by applying a voltage across the cell which causes a tunnelling current to flow through the cell and can switch the orientation of the magnetic moment of the ferromagnetic soft layer with respect to the ferromagnetic fixed layer. The switching is effected by means of an induced exchange interaction between the ferromagnetic fixed layer and the ferromagnetic soft layer related to spin-polarised electrons tunnelling through the tunnelling barrier. Since the addressing of the cells in the write process is direct, array-wide selectivity is achieved.

In GB 2 343 308, it is important for the write process to supply a strong enough tunnelling current to overcome the coercive field of the ferromagnetic soft layer. Therefore, the tunnel barrier has to be very thin. Because the tunnelling current increases exponentially with decreasing thickness of the tunnelling layer, local variations due to the manufacturing process become particularly pronounced for thin barriers. The less uniform the current distribution within the cell, the higher the total current has to be to create a strong enough excitation throughout the entire ferromagnetic soft layer. However, a too strong a current will eventually break the tunnel junction. Therefore, in GB 2 343 308 materials for the tunnelling layer have been proposed with a low energy barrier. Nevertheless, from a manufacturing point of view, there is still a very strong dependence on the quality of the manufacturing process.

It is an objective of the present invention to provide a magnetic memory cell, a method of and a circuit for writing a magnetic memory cell, and a magnetic memory which are improved with respect to the above mentioned drawbacks. It is a further objective of the present invention to provide a method of writing a magnetic memory cell which helps to overcome the above mentioned drawbacks.

SUMMARY OF THE INVENTION

These objectives are achieved by a magnetic memory cell as claimed in claim 1, a magnetic memory as claimed in claim 17, a method of writing a magnetic memory as claimed in claim 23, and a memory circuit as claimed in claim 27.

According to a first aspect of the invention, a magnetic memory cell is provided which comprises:

a first stack of one or more conductive layers having at least one first magnetic layer with a first magnetic moment;

a second stack of one or more conductive layers having least one second magnetic layer with a second magnetic moment;

a third stack of one or more non-magnetic layers, that is arranged between and contacting said first and said second stacks and allows a non-tunneling current to pass, a current control element allowing a current of up to at least a predetermined writing current amount to pass across the cell in a first direction perpendicular to the layer planes, and prohibiting a current to pass across the cell in a second direction opposite to said first direction, unless the current amount in the second direction is higher than a predetermined reading current amount, which reading current amount is lower than said writing amount, fn the memory cell of the invention, extensions of said layer stacks in a direction perpendicular to the layer planes, as well as the materials of said layer stacks are adapted to allow a change of an orientation of said first and second magnetic moments relative to each other with the aid of a current of at least said writing current amount, and to influence a current amount across the cell of at most said reading current amount by a giant magnetoresistance effect.

The invention is based on the idea that switching and reading the mutual orientation of the first and second magnetic moments can be improved if they do not rely on a voltage-driven tunneling current only.

The memory cell of the invention is designed to allow a current-driven switching of the orientation of the first and second magnetic moments relative to each other. For switching, a current is passed through the device. The orientation of the magnetic moment of the second magnetic layer relative to the magnetic moment of the first magnetic layer can be switched by sending a writing current amount in an appropriate direction through the device. The interaction of the charge carriers polarised by the first magnetic layer with the second magnetic layer is able to contribute to or effect alone a switching of the direction of the magnetic moment of the second magnetic layer, if the number of polarised charge carriers arriving at the second magnetic layer is high enough.

That means, in contrast to known MTJ memory cells the cell of the invention represents a low ohmic resistance in an electric circuit, such that a non-tunneling current may be led through the device at appropriate voltages during operation of the cell. However, this does not imply that the switching is necessarily based alone on the current passed through the cell. Embodiments of the invention which use other effects in addition to the current passed through the cell for switching the mentioned orientation will be described below. It is neither implied that there is no tunneling current at all involved in switching the device.

The memory cell of the invention has the advantage that the switching process has a "direct" component. This means that an individual memory cell of the invention in an array of such memory cells may be addressed directly in the switching process, for instance by selectively sending a current through a respective pair of bit- and word-lines, and the memory cell itself. This aspect of the invention will be explained below in further detail.

Another important feature of the memory cell of the invention is the provision of a stack structure that leads to a giant magneto resistance effect. The giant magnetoresistance effect is primarily exploited in reading the state of the memory cell. The giant magneto resistance (GMR) effect is well known in the art. It is, in short, best described as a very large change in electrical resistance that is observed in a ferromagnet/paramagnet multilayer structure when the relative orientations of the magnetic moments in alternate ferromagnetic layers change as a function of an applied magnetic field. In the memory cell of the invention, it is the mutual orientation of the first and second magnetic moments that is responsible for the GMR effect. If both moments are in parallel alignment, the resistance is low. If both moments are in anti-parallel alignment, the resistance is high. It is, in general, well known in the art what materials and layer extensions have to be provided in order to have a GMR effect influence the current through the cell in a reading operation. Preferred embodiments will be described be row.

A further important aspect of the memory cell of the invention is the current control element. The current control element provides selectivity of addressing an inventive memory cell in an array of such memory cells. The current control element of the memory cell of the invention allows a current of up to at least a predetermined writing current amount to pass across, Le., through the cell in a first direction perpendicular to the layer planes. The writing current amount can be determined by methods known per se. It depends on the particular materials and cell structure chosen. The writing current amount provides a magnetic field component that, either alone or in synergy with further magnetic field components provided by further means described below, is able to switch the mutual orientation of the first and second moments. The writing current can be lead through the device in either direction. This is important, because the direction of the current determines the orientation of a magnetic field component caused by the current. In order to switch the orientation of the first and second magnetic moments, a current direction depending on the present state of the mutual orientation of the magnetic moments has to be chosen. The current direction can be chosen by applying an electric potential of appropriate sign across the cell in a respective direction perpendicular to the layer planes.

The current control device of the memory cell of the invention prohibits a current to pass across the cell in a second direction opposite to said first direction, unless the current amount in the second direction is higher than a predetermined reading current amount, which reading current amount is lower than said writing amount. This makes sure that reading the state of the memory cell, i.e., the mutual orientation of the first and second magnetic moments, is possible in only one current direction. As a current control element a Zener diode may for example be used.

The inventive magnetic memory cell acts as a spin valve. Charge carriers, usually electrons, which are sent through the first magnetic layer are spin polarised according to the direction of the magnetic moment of this layer. The spin polarised electrons can be conducted through the non-magnetic conductive layer stack to the second magnetic layer. If the magnetic moment of the second magnetic layer is in parallel orientation with respect to the magnetic moment of the first magnetic layer, the magnetoresistance of the device is low. If, on the other hand, the magnetic moment of the second magnetic layer is in anti-parallel orientation with respect to the magnetic moment of the first magnetic layer, the magneto resistance is high. The difference in the two resistances can be utilized in ascertaining the state of orientation of the second magnetic layer's magnetic moment relative to the first magnetic layer's magnetic moment, i.e., for reading the state of the cell. This relative orientation can for example be used for storing bits, with the parallel orientation representing a "0" and the anti-parallel orientation representing a logical "1", or vice versa.

In the MTJ-device according to the prior art, the isolation layer sandwiched between the two magnetic layers has to be very thin in order to achieve a concentration of spin polarised charge carriers which is high enough for switching the device because the tunnelling current through the isolation layer decreases exponentially with increasing thickness of the layer. Therefore, either a high voltage has to be applied across device to allow for high enough tunnelling current or the tunnelling layer, i.e. the isolation layer, has to be very thin to allow the switching to occur.

In contrast thereto, in the inventive magnetic memory cell the resistance of the non-magnetic layer stack sandwiched between the magnetic layers shows only a linear or close to linear dependence on the layer thickness. Therefore, the thickness of this layer stack is much less critical than the thickness of the Insulation layer in an MTJ-device.

In the inventive memory cell, the thickness and/or the material of said third stack is/are chosen such as to prevent permanent coupling of the orientations of said first and second magnetic moments. In a device incorporating a giant magnetoresistance effect ferromagnetic or antiferromagnetic coupling occurs between the first and second stacks for certain thicknesses of the metallic layer stack sandwiched between the magnetic layers. For example, if the magnetic layers are made of cobalt and the non-magnetic layer stack is made of copper, an antiferromagnetic coupling occurs at a thickness of about 8 A and at a thickness of about 19 to 21 A, a ferromagnetic coupling Occurs at a copper thickness of about 10 to 15 A, and no coupling occurs at about 9 A and about 17 A Therefore, for copper as material of the third layer stack a thickness of about 9 A or about 17 A may be chosen, in principle. In fact, in a GMR-system several thickness of the sandwiched metallic layer exist which cause a coupling of the magnetic moments of the magnetic layers. However, the coupling gets weaker with increasing thickness of the conductive layer. Above a certain thickness, the coupling is negligible. Preferably the thickness of the non-magnetic conductive layers is above the certain thickness.

In the inventive magnetic memory cell, the first magnetic layer is in particular a ferromagnetic fixed layer, which can be fixed by providing a strong anisotropy, by an additional antiferromagnetic layer such as CoO, or by an artificial antiferromagnetic sandwich such as Co/Cu/Co where an antiferromagnetic coupling between the Go layers is established by choosing the thickness of the Cu of about 8 A or 19 to 21 A, and the second magnetic layer is in particular a ferromagnetic soft layer so that the orientation of the second magnetic layer's magnetic moment is variable with respect to the first magnetic layers magnetic moment. The thickness of the ferromagnetic soft layer may be even less than 5 atomic layers but still thick enough not to become superparamagnetic. To increase the resistance of the ferromagnetic soft layer, a sandwich made of different soft ferromagnetic layers including ferromagnetic semiconductors or halfmetals may be used.

The extension perpendicular to the layer plane, hereinafter also referred to as the thickness, and/or the material of said first stack of layers is particularly chosen such that the electrons having passed through this stack are spin polarised to a predetermined degree and thickness and/or the material of said third stack of non-magnetic material is particularly chosen such that the spin polarisation is still recognisable at the location of the second magnetic layer. If the non-magnetic layer stack is too thick, the degree of polarization of the charge carriers decreases too much so that no switching of the ferromagnetic soft layer can be achieved. Therefore, a certain thickness of the non-magnetic layer should not be exceeded. For many materials the polarisation is still strong enough to switch the ferromagnetic soft layer at least until a thickness of about 80 to 100 nm. On the other hand, the thickness of said third layer, i.e. the non-magnetic conductive layer, should in particular be chosen such that no permanent coupling between the first and the second magnetic layers occurs. This aim can be achieved e.g. by choosing the thickness of the sandwiched metallic layer according to the principles outlined above. The third layer stack may preferably have a thickness between 3 and 20 nm, more preferably between 5 and 10 nm.

In the inventive magnetic memory cell, the first and third stacks of layers are arranged on a first side of said second stack of layers. In addition, the magnetic memory cell may comprise a fourth and a fifth stack of layers, which are both arranged at a second side of the second stack which lies opposite to the first side. The fourth stack is a stack of one or more conductive layers and comprises at least one third magnetic layer having a third magnetic moment which is aligned anti-parallel to said first magnetic moment. The third magnetic layer is in particular a ferromagnetic fixed layer, which Can be fixed according to the principles outlined above for the first magnetic layer. The fifth stack is a stack of one or more non-magnetic layers, that allow a current to pass, and separates said fourth stack from said second stack. The idea of providing said fourth stack of layers and said fifth stack of layers is also applicable to other kinds of magnetic memories. By providing the fourth and the fifth stacks, the spin polarisation of the charge carriers at the location of the second stack, in particular at the location of the second magnetic layer, can be enhanced.

If the magnetic moment of the first and the third magnetic layers are in antiparallel orientation, it is more difficult for the charge carriers which have been spin polarised by the first magnetic layer to pass the third magnetic layer so that many of them will be reflected. This reflection increases the number of spin polarised charge carriers at the location of the second magnetic layer.

The thickness and/or the material of said fifth stack is chosen such as to prevent from parallel or anti-parallel coupling of the orientations of said third and second magnetic moments. Further, the thickness and/or the material of said fifth stack is chosen such that the spin polarisation of the charge carriers reflected by said third magnetic layer does not affect the read process at low current levels but is still recognizable at the location of said second magnetic layer for strong currents during the write process. The thickness is therefore of the order of the spin-diffusion length for the material of said fifth stack, that is at least of the order of 100 nm for the example of Cu. Alternatively, a semi-conducting material can be used instead with a thickness of at least a few monolayers.

In an alternative embodiment of the present invention said fifth stack is replaced by a thin layer with a long spin diffusion length of at least a few monolayers thickness adjacent to the second magnetic layer followed by a layer with a short diffusion length and a thickness of the same order as its spin diffusion length.

In a similar manner, two or more magnetic memory cells according to the invention may be coupled in series being separated from each other by the fifth layer stack which forms a separation layer stack. Connecting the memory cells in series allows for averaging over parameter variations of the devices and for increasing the resistance of the device. In contrast to the MRAM cells of the state of the art, an averaging can be achieved without increasing the lateral dimensions of the device because the current for switching the state of the second magnetic layer as well as the current for reading the state of the second magnetic layer flows through the device. In prior art devices, a cell in which two or more devices are connected in series causes problems in writing the cell by means of a current passing by the cell due to the increased thickness of such a cell. On the other hand, in an MTJ-device where the write current passes through the device, connecting such devices in series would decrease the current passing through the devices because more than one tunneling process would be necessary.

According to claim 17, a magnetic memory is provided, comprising an array of inventive memory cells.

The inventive magnetic memory may comprise a flux return structure for closing the magnetic flux of a number of memory cells. Such a flux return structure reduces the stray fields of the magnetic layers. The flux return structure is not only applicable to magnetic memory cell but also to other kinds of magnetic memories.

In an inventive magnetic memory having at least a first row of memory cells, said flux return structure is designed and arranged such that the orientation of the magnetic moments of all first magnetic layers of said memory cells is the same throughout all memory cells which belong to the same row and that the orientation of the magnetic moments of all third magnetic layers is the same throughout all memory cells which are arranged in the same row. Further, the magnetic moments of said first and said third magnetic layers of the memory cells belonging to the same row are in anti-parallel alignment with respect to each other. The anti-parallel orientation is achieved if the first and third magnetic layers have different coercivities. Different coercivities can for example be provided by pinning first magnetic layers with an antiferromagnet, choosing different materials for the magnetic layers, or, if the magnetic layers are made of the same material by giving the magnetic layers different thickness.

To achieve the same orientation of all magnetic moments of said third magnetic layers throughout all memory cells belonging to a row, the respective magnetic layer may be a common layer for all these memory cells. Additional flux closure may be provided by introducing an electrically disjunct flex return layer between each cell in a row and at both ends of each row which may be for example an insulating soft magnetic ferrite. To lower the variability of the switching fields of the ferromagnetic soft layer during a write process, flux closure along the hard-axis direction may be provided by introducing a electrically disjunct keeper layer around two sides and on top of each cell which may be for example an insulating soft magnetic ferrite.

The principles of providing of flux closure described herein are not restricted to memories built up from giant magnetoresistance devices according to the present invention but are also applicable to memories built up from other magnetic memory devices.

According to the invention, a method of writing a memory cell in which data is stored in a magnetic storage layer having a magnetic moment, comprises the steps:

causing a flow of charge carriers through the memory cell by applying a voltage across the memory cell;

spin polarising the charge carriers by passing them through a magnetic layer having a magnetic moment with a defined orientation;

passing the spin polarised charge carriers through the magnetic storage layer and writing said magnetic storage layer with the aid of the interaction of the polarised charge carriers with said magnetic moment of said magnetic storage layer.

The method of the invention comprises at least one step of passing a support current by the location of the memory cell, said additional current generating a magnetic field that is adapted to support writing of the magnetic storage layer.

According to the method of the invention, the switching of the magnetic moment of a magnetic storage layer like, e.g., the second, that is the ferromagnetic soft magnetic layer of the memory cell of the invention, is achieved by two magnetic field components. One is generated by a spin polarised current led through the memory cell, the other is generated by a current led by the location of the memory cell. The first has been described above in the context of the memory cell of the invention and will be further explained with reference to the figures. The direction of the latter current has to be chosen to add to the field component of the first constructively, i.e., to enhance the total amplitude of the field, that is, increase the amount of the sum of both field components in the direction of the desired new orientation of the magnetic moment of the storage layer. It is noted that both field components are vectors and may in general have a non-vanishing amount in more than one direction. The direction of the field component maybe controlled by the direction of the current, which can be influenced by the direction of an electrical potential applied across the conductor carrying the current and its arrangement relative to the storage layer plane of the memory cell.

The conductor for leading by the current need not be contacting the memory cell. It may be at a distance from the memory cell. However, with increasing distance, the amplitude of the field component generated by the additional current at the position of the storage layer decreases, so that a higher current is needed to provide the same magnetic field component from a higher distance.

In a preferred embodiment of the invention said support current comprises a current impulse adapted to generate a hard-axis field component in the magnetic layer of the second stack for a predeterimed time span. In this embodiment, the support current provides a "kick" to the magnetic moment of the storage layer that effects a misalignment relative to a ferromagnetic fixed layer. After the impulse, the magnetic moment is neither parallel nor antiparallel. This makes it easier to complete the switching process using, e.g., the spin polarised current lead through the cell. Preferably, the current amount of said current impulse is adapted to create a magnetic filed lower than the coercive field of the storage layer.

However, in an alternative to this embodiment, the current amount of said current impulse is adapted to create a magnetic filed higher than the coercive field of the storage layer, but the time span the created field component is interacting with the magnetic moment of the storage layer is short enough not to write the magnetic storage layer by the support current impulse alone.

The spin polarisation of the charge carriers is achieved as described above by passing them through a polarisation layer, i.e. first magnetic layers. The orientation of the charge carriers' spin polarisatian is determined by the direction of the flow of charge carriers through said polarisation layer together with the orientation of the polarisation layer's magnetic moment. The orientation of the charge carriers' spin polarisation is reversed by changing the direction of current flow. During a write process the density of polarised charge carriers at the location of the magnetic storage layer can be enhanced by not only passing the charge carriers through a polarisation layer before passing them through the magnetic storage layer but also passing the charge carriers through a further polarisation layer, which is oriented antiparallel to the first polarization layer, after passing them through the magnetic storage layer.

According to a further aspect of the invention, a memory circuit is provided for writing a magnetic memory cell, in particular a memory cell according to any of the claims 1 to 16, comprising at least one bit line, at least one word line crossing the bit line, and at least one memory cell located at the crossing of the bit line and the word line and being connected between the bit line and the word line, wherein a bit line controller is connected to the bit line and a word line controller is connected to the word line, wherein the bit line controller provides at least a switching state for applying a sensing voltage Vs, a switching state for applying a positive reference voltage, and a switching state for applying negative reference voltage to the bit line, and wherein the word line controller provides at least a switching state for connecting a read out circuit, a switching state for applying the positive reference voltage, and a switching state for applying the negative reference voltage to the word line.

The bit line controller and the word line controller each may provide a switching state which provides an open circuit state of the respective one of the bit line and the word line.

As an option, the memory circuit may comprise a second bit line controller which is connected to the bit line and a second word line controller which is connected to the word line.

The second bit line controller provides a switching state for applying a second positive voltage which is less positive than the positive reference voltage by the amount of a difference voltage to the bit line, and a switching state for applying a second negative voltage which is less negative than the negative reference voltage by the amount of said difference voltage to the bit line.

The second word line controller provides a switching state for applying a third positive voltage which is more positive than the positive reference voltage by the amount of said difference voltage to the word line, and a switching state for applying a third negative voltage which is more negative than the negative reference voltage by the amount of said difference voltage to the word line.

In addition, the second bit line controller and the second word line controller each may provide a switching state which provides an open circuit of the respective one of the bit line and the word line.

BRIEF DESCRIPTION OF THE DRAWINGS

Additional features and advantages of the present invention will be elucidated by the following detailed description of embodiments of the invention with reference to the accompanying drawings in which.

DETAILED DESCRIPTION OF THE DRAWINGS

Figure 1:
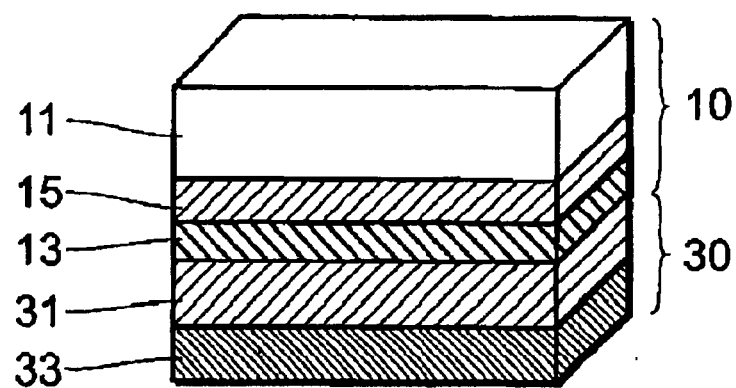
FIG. 1 shows a perspective view of a magnetic memory cell according to a first embodiment of the present invention.

A first embodiment of the present invention will now be described with respect to FIG. 1. The memory cell shown in FIG. 1 has a GMR cell section 10 and a current control section 30. The GMR cell section 10 comprises three layer stacks which in the present embodiment are built up from a ferromagnetic fixed layer 11 (FMF), a ferromagnetic soft layer 13 (FMS), and a nonmagnetic, preferably conductive layer 15 sandwiched between the ferromagnetic fixed layer 11 and the ferromagnetic soft layer 13. In an alternative implementation of the first embodiment, the order of the stacks of the GMR cell section 10 may be reversed. As materials for the ferromagnetic fixed layer 11 and the ferromagnetic soft layer 13 all materials showing a giant magnetoresistance effect may in principle be used. Such materials comprise for example the ferromagnetic elements cobalt (Co), iron (Fe), nickel (Ni) and ferromagnetic alloys containing these elements and iron zirconium (FeZr). The magnetic moment of the ferromagnetic fixed layer 11 may be pinned by using an anti-ferromagnet or preferably a synthetic anti-ferromagnetic structure, e.g. a sandwich structure with layers of cobald and copper.

In any case, the ferromagnetic fixed layer should be made such as to have a high coercive field with respect to the ferromagnetic soft layer. This can either be achieved by making the ferromagnetic fixed layer rather thick with respect to the thickness of the ferromagnetic soft layer, or by choosing a material having a high intrinsic coercive field (so called hard ferromagnetic material). On the other hand, the ferromagnetic soft layer should be made from a material having a coercive field which is considerably smaller than the coercive field of the ferromagnetic fixed layer. This can be achieved by giving the soft layer a considerably smaller thickness than the thickness of the ferromagnetic fixed layer (in particular, if both layers consist of the same material) or by choosing a material for the ferromagnetic soft layer which has a small intrinsic coercive field.

In particular, nickel, doped ferromagnetic semiconductor materials such as GeMn or GaAsMn (Ge: germanium, Ga: gallium, As: arsenic, Mn: manganese), or a combination of a metallic ferromagnetic material and a ferromagnetic semiconductor material may be chosen for the ferromagnetic soft layer. Useful combinations of ferromagnetic metallic and ferromagnetic semiconductor materials may be layer stacks like GeMn/NiFe/GeMn, NiFe/GeMn/NiFe, Fe/FeSi/Fe (Si: silicon), or Fe(Ni)Zr/Cr02/Fe(Ni)Zr (Zr: zirconium).

Copper (Cu), or chromium (Cr) may, for example, be used as materials for the non-magnetic layer 15. The ferromagnetic fixed layer 11 and the ferromagnetic soft layer 13 are fabricated to have easy axes of magnetisation that align with each other. By using for the ferromagnetic fixed layer 11 a material with a particularly high anisotropy, such as Co—Pt—Cr alloy (PCT platinum), the direction of magnetisation of the easy axis of the ferromagnetic fixed layer is fixed against the one of the ferromagnetic soft layer 13. Alternatively, the direction of magnetisation of the ferromagnetic fixed layer 11 can be set by an unidirectional anisotropy as given, for example, in U.S. Pat. No. 5,465,185. The magnetic moment of the ferromagnetic soft layer 13 may adopt two possible orientations along its easy axis, which define the two states of the memory cell, namely parallel or anti-parallel to the magnetic moment of the ferromagnetic fixed layer. In addition, the ferromagnetic soft layer 13 may be fabricated to have a low coercivity by giving it an elliptical, a hexagonal or an octagonal shape, or forming tapers at the corners in order to suppress the effects of edge domains.

Additional layers may be provided in all layer stacks of the GMR cell section 10, for example in order to reduce lattice mismatch throughout a stack or between neighbouring stacks.

The current control section 30 comprises a Zener-diode which is formed on or in a semiconductor substrate such as silicon (S1) and contains p- and n-doped layers 31 and 33 which are e.g. formed of Silicon. A pn-junction is formed between the p-doped and the n-doped layers 31 and 33. The Zener-diode can be operated through a reverse breakdown voltage in the avalanche breakdown region.

The Zener-diode accommodates two operational regimes. One regime for the sense operation and the other one during write operations where, for writing at least one of the two possible logical states, a reverse voltage has to be applied to the Zener-diode that exceeds the breakdown voltage.

Instead of a Zener-diode, any other non-linear current control or current selection device with an I-V-characteristics or operational regime similar to a Zenerdiode may be used, e.g. a double barrier structure.

The ferromagnetic fixed layer 11 and the current control section 30 are in contact with a bit line and a word line, respectively (not shown). Between the bit line and the ferromagnetic fixed layer 11 as well as between the current control section 30 and the word line may be provided an additional contact layer (not shown) which may be e.g. made of copper or platinum.

Figure 2:
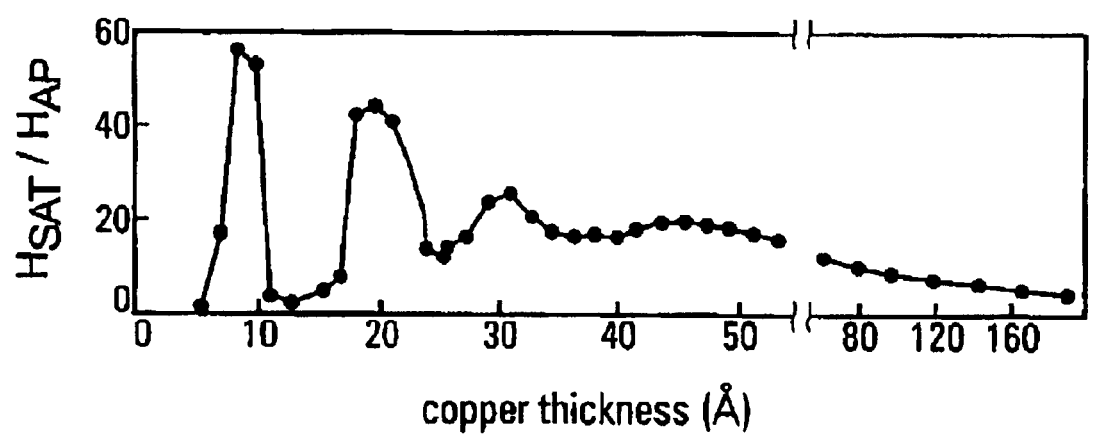
FIG. 2 shows the dependence of the magnetic coupling of layers in an giant magnetoresistance device on a non-magnetic layer sandwiched between the magnetic layers.

Next, the principles of the operation of the inventive memory cell will be explained with reference to FIGS. 2 and 3.

Non-polarised electrons of a current led though the memory cell become spin polarised when passing through the ferromagnetic fixed layer 11 of the GMR cell section 10, i.e., the spin of the electrons will be aligned in parallel orientation with respect to the magnetic moment of the ferromagnetic fixed layer after they have passed through this layer. This means that in the current flowing through the memory cell the number of electrons having a spin which is aligned parallel to the magnetic moment of the ferromagnetic fixed layer 11 is higher than the number of electrons having a spin in anti-parallel orientation with respect to the magnetic moment of the ferromagnetic fixed layer 11. The spin polarisation, i.e. the difference between the number of electrons with spin aligned parallel and spin aligned anti-parallel with respect to the ferromagnetic fixed layer's magnetic moment, is related to a so-called exchange field HE which interacts with the ferromagnetic soft layer 13. If the spin polarisation is high enough, the interaction of the exchange field HE with the ferromagnetic soft layer 13 is strong enough to switch the orientation of the magnetisation of this layer. Switching by leading a current through the memory cell is referred to as direct switching. For a read operation, the exchange field HE is kept small enough so that no switching of the ferromagnetic soft layer 13 occurs.

The degree of spin polarisation reduces with the length of the way the electrons have to pass through the non-magnetic layer 15. Therefore, the nonmagnetic layer 15 should have a thickness which is small enough not to reduce the degree of spin polarisation so much that the exchange interaction is unable to change the orientation of the magnetic moment of the ferromagnetic soft layer 13 with respect to the magnetic moment of the ferromagnetic fixed layer 11. Depending on the material used for the non-magnetic layer 15, this layer may have a thickness up to more than 100 nm.

On the other hand, the nonmagnetic layer 15 should be thick enough to prevent a permanent coupling of the orientation of the ferromagnetic soft layer's magnetic moment to the ferromagnetic fixed layer's magnetic moment. To achieve this, the non-magnetic layer 15 should, depending on the material, have a thickness of more than about 50 A. However, the coupling strength between the ferromagnetic fixed layer 11 and the ferromagnetic soft layer is not constant but depends on the thickness of the non-magnetic, preferably conductive layer 15. This dependency results in different ratios $H_{sat}/H_{AP}$ of the magnetic saturation filed $H_{sat}$ to the magnetic field $H_{AP}$ in case of anti parallel alignment of the magnetic moments of the ferromagnetic layers for different thicknesses of the non-magnetic layer 15. If, for example, both ferromagnetic layers 11, 13 consist of cobalt and the non-magnetic layer 15 consists of copper, the $H_{sat}/H_{AP}$-ratio shows a dependence on the copper thickness as shown in FIG. 2. At about 8 A a first maximum in the $H_{sat}/H_{AP}$-ratio occurs. This maximum means that the magnetic moments of both ferromagnetic layers are coupled in anti-parallel orientation. On the other hand a minimum in the $H_{sat}/H_{AP}$-ratio occurs at about 10–15 A, which means that the magnetic moments of the ferromagnetic layers are coupled in parallel orientation. Between the maximum and the minimum, i.e. at about 9 A, no fixed coupling of the magnetic moments of both ferromagnetic layers exists. Therefore, a thickness between a maximum and a minimum may also be chosen as a thickness for the non-magnetic layer 15. In the cobalt-cop per-system such a thickness would be about 9 A, about 17 A, about 22 A and so on. The coupling between the magnetic moments of the ferromagnetic layers becomes negligible above a thickness of about 30 A.

Figure 3:
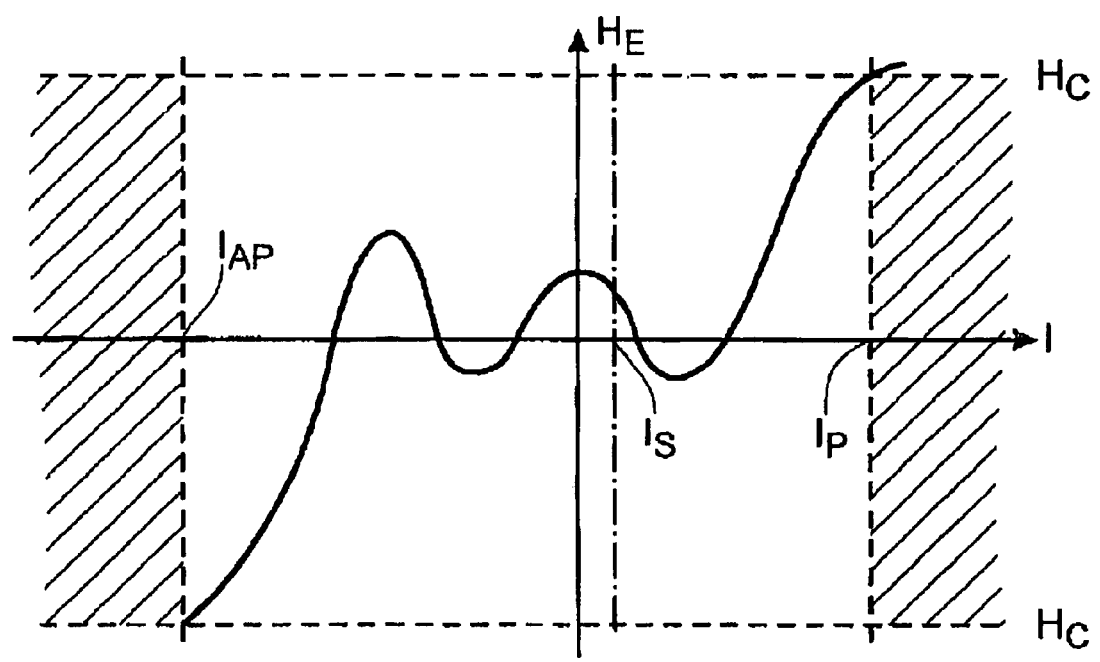
FIG. 3 shows the exchange field-current response of an inventive magnetic memory cell in relation to the coercive filed He of the ferromagnetic soft layer.

FIG. 3 shows the strength of the exchange interaction represented by the exchange field $H_E$ versus the current I flowing through the GMR cell section 10. When the current flow through the GMR cell is increased from the vicinity of zero beyond the forward current Ip such that $H_E > H_c$ and lowered back again to the inception point, the ferromagnetic soft layer 13 will be left in parallel alignment with the ferromagnetic fixed layer 11. Similarly, when the current I is increased beyond 1AP such that $H_E < -H_c$ and subsequently lowered again to close to zero, the ferromagnetic soft layer 13 and the ferromagnetic fixed layer 11 will be left in anti-parallel alignment. A sensing of the cell can be achieved by sending a small sensing current $I_s$ through the GMR cell section 10 and measuring the resistance differential $\Delta R/R$ with respect to a given reference value. $I_s$ is thereby substantially smaller in the absolute magnitude than both $I_P$ and $I_{AP}$.

It should be noted that the invention is not limited to the use of a single ferromagnetic fixed layer 11 and a single ferromagnetic soft layer 13. Instead, it is possible to replace one or both of the ferromagnetic layers by stacks of magnetic layers in order to tune the magnetic moment, the anisotropy, and the coercivity of these layers. Similarly, the transmission characteristics of the non-magnetic layer 15 can be tuned by replacing it with a stack of nonmagnetic layers.

A second embodiment of the present invention will now be described with respect to FIG. 4. Like in the first embodiment, a GMR memory cell of the second embodiment comprises a GMR cell section 10' and a current control section 30, In the GMR cell section 10' of this embodiment, the sequence of layer stacks 11, 15, and 13 is reversed with respect to the GMR cell section 10 of the first embodiment. The current control section 30 is identical to the current control section 30 of the first embodiment. Like in the first embodiment a Zener-diode or any other non-linear current control or current selection device with an I-V-characteristics or operational regime similar to a Zener-diode may be used.

The difference between the first and the second embodiment lies in the structure of the GMR cell section 10'. In the second embodiment, the GMR cell section 10' comprises in addition to the ferromagnetic fixed layer 11 (FMF), the ferromagnetic soft layer 13 (FMS), and the non-magnetic layer 15, that allows a current to pass, an additional ferromagnetic fixed layer 17, in the following referred to as ferromagnetic back layer or just back layer 17, and a non-magnetic separation layer 20, that allows a current to pass, sandwiched between the ferromagnetic soft layer 13 and the ferromagnetic back layer 17.

The ferromagnetic back layer 17 helps to enhance the spin polarisation of the electrons flowing through the device at high currents during a write process if the magnetic moment of the ferromagnetic back layer 17 is in anti-parallel orientation with respect to the magnetic moment of the ferromagnetic fixed layer 11. In this case, the electrons having a spin aligned parallel to the magnetic moment of the ferromagnetic fixed layer 11 (I.e. aligned anti-parallel to the magnetic moment of the ferromagnetic back layer 17) will not escape as easily through the ferromagnetic back layer 17 than electrons with spin aligned antiparallel to the magnetic moment of the ferromagnetic fixed layer 11 (i.e. aligned parallel to the magnetic moment of the ferromagnetic back layer 17). Therefore the number of electrons having a spin aligned parallel to the magnetic moment of the ferromagnetic fixed layer 11 to the number of electrons having a spin aligned anti-parallel to the magnetic moment of the ferromagnetic fixed layer 11 will be further increased resulting in a higher degree of spin polarisation in the area between the ferromagnetic fixed layer 11 and the ferromagnetic back layer 17. This facilitates the writing of the memory cell as lower writing currents may be used. It is to be noted that, when the direction of the current is reversed, the meanings of the ferromagnetic fixed layer 11and the back layer are reversed, too.

The separation layer 20 has two functions. At low current levels during a read process, separation layer 20 is such that the magnetic response of the GMR cell section 10' is independent of the relative orientation of the magnetic moments of the ferromagnetic back layer 17 to those of the ferromagnetic soft layer 13. At high current levels during a write process, on the contrary, separation layer 20 is such that the spin polarisation of the electrons flowing through the device is enhanced by the ferromagnetic back layer 17 at the location of the ferromagnetic soft layer 13. The thickness of the separation layer 20 may therefore be chosen of the order of the spin-diffusion length for that material that is at least of the order of 100 nm for Cu. Alternatively, a semiconducting material can be used instead with a thickness of at least a few monolayers. Yet another alternative embodiment of the present invention is that the separation layer 20 is replaced by a thin layer with a long spin diffusion length such as Cu of at least a few monolayers thickness adjacent to the second magnetic layer followed by a layer with a short diffusion length such as Titanium and a thickness of the same order as its spin diffusion length.

Figure 4:
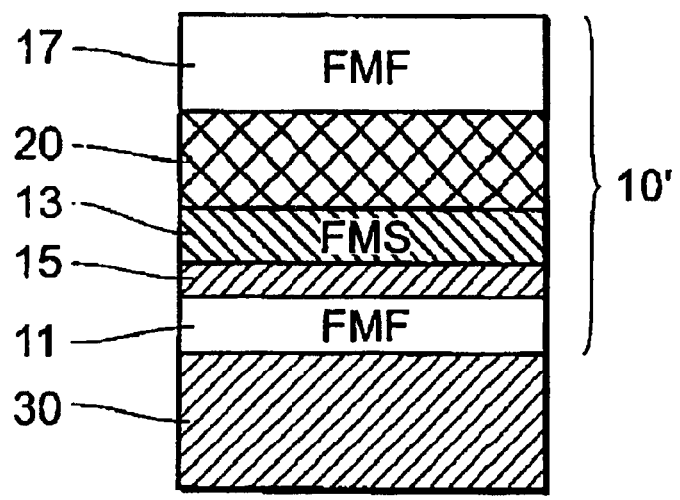
FIG. 4 shows a second embodiment of a magnetic memory cell according to the present invention.

In the embodiment shown in FIG. 4, the ferromagnetic fixed layer 11 and the back layer 17 are made of the same material with the ferromagnetic fixed layer being thicker than the back layer. As a consequence, the back layer 17 has a smaller coercive field He than the ferromagnetic fixed layer 11. Therefore, the magnetic moment of the back layer 17 can be aligned anti-parallel with respect to the magnetic moment of the ferromagnetic fixed layer 11. However, the ferromagnetic fixed layer 11 and the back layer 17 should be thick enough to allow for maximum polarisation in layers 15, 13, and 20. On the other hand, if materials having different intrinsic coercive fields are used for the ferromagnetic fixed layer 11 and the back layer 17 the thickness of both layers may be the same. As materials for forming the back layer, the same materials as for forming the ferromagnetic fixed layer are suitable.

Figure 5:
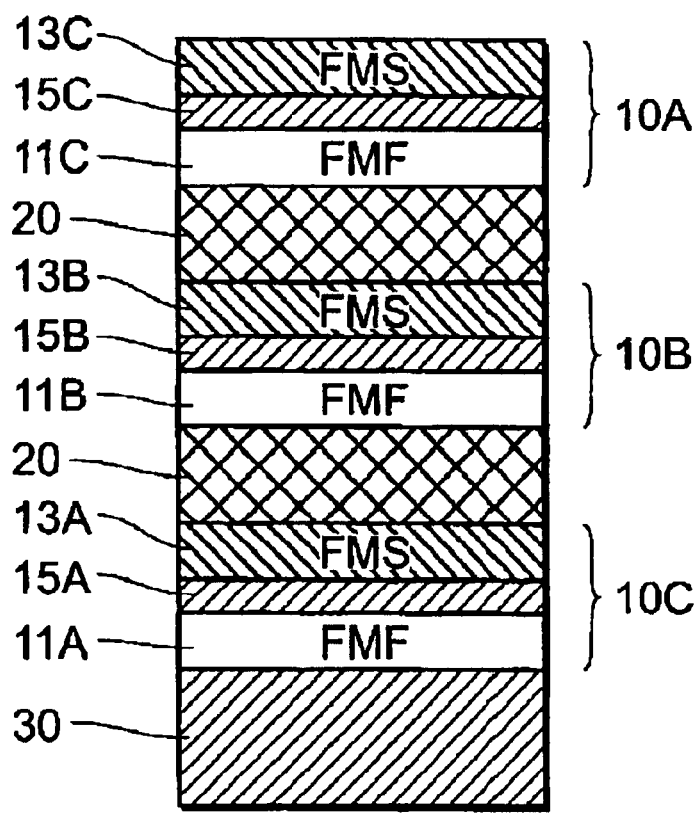
FIG. 5 shows a third embodiment of a magnetic memory cell according to the present invention.

A third embodiment of the present invention will now be described with respect to FIG. 5. In this embodiment, three GMR cell sections 10 A, 10 B and 10 C, each of which comprises at least ferromagnetic fixed layer 11, a ferromagnetic soft layer 13 and a non-magnetic layer 15, are connected in series. The series connection leads to an averaging of the characteristic parameters of the three cell sections. This averaging facilitates the production of memory cells having reproducible operational characteristics. The more cell sections are present in a memory cell, the better is the averaging of the characteristic parameters. In this embodiment, the series connection of the memory cell sections also helps to increase the resistance of the memory cell which allows for a stronger read signal. The GMR cell sections are separated from each other by the separation layer 20 with properties according to the above outlined principles.

Figure 6:
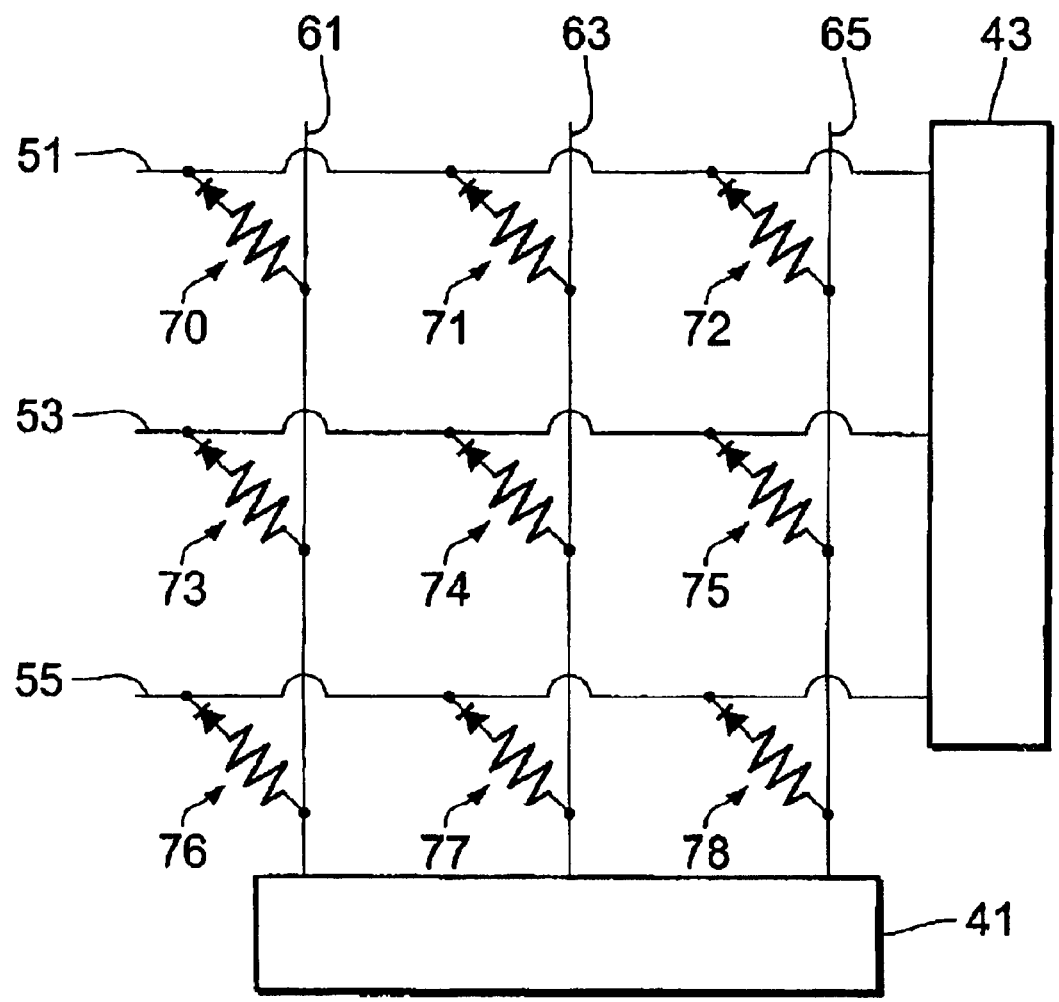
FIG. 6 shows schematically a diagram of the electric circuit formed by an magnetic memory according to the invention.

A schematic circuit diagram of the GMR memory according to the present invention is shown in FIG. 6. The memory comprises a plurality of memory cells 70–78, a plurality of word lines 51, 53, 55, a plurality of bit lines 61, 63, 65, a bit line control circuit 41, and a word fine control circuit 43. The memory cells 70 to 78 are arranged at the crossings of the bit lines and the word lines and are connected between the respective bit- and word line. As memory cells 70 to 78 memory cells described with respect to FIGS. 1, 4, and 5 may be used.

A memory cell in the memory cell array can be read by applying a small sensing voltage across the memory cell via the respective bit- and word lines which causes a sensing current to flow through the memory cell. If the magnetic moment of the ferromagnetic soft layer 13 is in parallel orientation to the magnetic moment of the ferromagnetic fixed layer 11, the resistance of the memory cell is lower as if the ferromagnetic moment of the ferromagnetic soft layer 13 is in anti-parallel orientation with respect to the magnetic moment of the ferromagnetic fixed layer 11. Therefore, by determining the voltage drop across the memory cell, the orientation of the ferromagnetic soft layer's 13 magnetic moment relative to the ferromagnetic fixed layer's 11 magnetic moment can be determined. The parallel and the anti-parallel orientation of the ferromagnetic soft layer's 13 magnetic moment represent a logical "0" and a logical "1", respectively, or vice versa.

While reading a memory cell, a current flows from a bit line through the selected memory cell to a word line. By measuring the current, the resistance of the memory cell is determined. In order to measure the correct current, i.e. the current which flows through the memory cell to be read, one has to assure that no currents flow through current paths parallel to the current path through the memory cell to be read. For example, if the memory cell number 74 in FIG. 6 is to be read a current flows from the bit line 63, through the memory cell 74 to the word line 53. If there were parallel current paths, the measured current would be higher than the current actually flowing through the memory cell number 74. To prevent a current from flowing through a parallel current path, all memory cells are provided with the current control section 30 (see FIGS. 1, 4, and 5). A parallel current path would mean that the current flows from the bit line 63 to the word line 53 through, for example, memory cell number 77, then through memory cell number 78 and then through memory cell number 75. Through cells 77 and 75 the current could flow in the forward direction of the current control section, whereas in cell 78 the current would have to flow in the reverse direction of the current control section, which is prevented by the current control section. Therefore, the current control section in the memory cells prevent from having current paths which run parallel to the current path through the memory cell to be read.

For writing a memory cell, the direct addressing is used, in which a strong voltage difference is applied across the memory cell which induces a current flow through the cell which is considerably higher than the current flow in a read operation. The logical state which is written into the memory cell depends of the direction of current flow through the memory cell. Therefore, in order to allow a current flow in both directions when writing the memory cell, a current control section is used. If the voltage applied across a current control section in reverse direction is high enough, i.e. higher than the breakdown voltage of for example a Zener diode used as a current control section, a write current can flow through the memory cell in either direction.

The operation of a memory cell array according to the present invention will now be described in more detail with respect to FIG. 7. First, the cell 70 is switched to a parallel alignment representing a logical "1", then the state of the cell 70 is sensed. Subsequently, the cell is switched to an anti-parallel alignment representing a logical "0" after which the state of the cell is sensed again. During the direct switching to state "1", a voltage VF is applied to bit line 61, using circuit 41. At the same time the voltage on bit lines 63 and 65 as well as on word line 51 are set to zero while the word lines 53 and 55 are also biased to the voltage VF using both circuits 41 and 43. The voltage VF across the memory cell 70 induces a current $I_p$ flowing across the GMR memory cell which is strong enough to switch the orientation of the ferromagnetic soft layer in the memory cell to a parallel alignment. While the cell 70 is now biased for ward at $V_F$, cells 71, 72, 73, and 76 are unbiased and cells 74, 75, 77, and 78 are reverse biased at $-V_F$ which is still less than the breakdown voltage of the Zener-diode and therefore does not lead to a substantial current flow through the GMR memory cell.

A sensing operation is carried out by applying a sensing voltage $V_s$ to bit line 61, while setting the voltage on the word line 51 to zero. At the same time, bit lines 63, 65 are kept at zero voltage whereas word lines 53, 55 are biased to $V_s$. This way it can be seen that there will be a positive voltage drop Vs across cell 70, whereas all the other cells either have no voltage drop across them or a small reverse voltage $-V_s$ which is smaller than the breakdown voltage of the Zener-diode. The voltage drop $V_s$ causes a sensing current Is to flow through the memory cell 70.

Finally, an operation to write a logical "0" into cell 70 is achieved by setting the voltage on bit line 61 to $-V_R$ while setting the voltage on word line 51 to $V_R$. The total voltage drop across the cell 70 of $-2V_R$ is now such that it is greater than the reverse breakdown voltage of the current control section, for example a Zener-diode, and such that it induces a current flow through the GMR memory cell which is strong enough to switch the ferromagnetic soft layer to "0". At the same time, the voltage on bit lines 63 and 65 are left at zero, while the voltages on word lines 53, 55 are kept at $V_s$. Neither of the voltage drops of $-V_R$ and $-V_R+V_s$ across cells 71, 72 and 73, 76, respectively, are high enough to cause a reverse breakdown of the current control section, for example a Zener-diode, thus avoiding a notable current flow across the relevant memory cells.

The switching may be supported by additional currents passing by the location of the memory cell. With such additional currents the current fed through the memory cell to perform the direct switching may be reduced. For passing the additional currents by the memory cell, either the word lines and the bit lines or additional lines which are specially provided for this task can be used.

The combination of direct switching and switching by currents passing by the memory cell will now be described with respect to FIG. 8.

Figure 8:
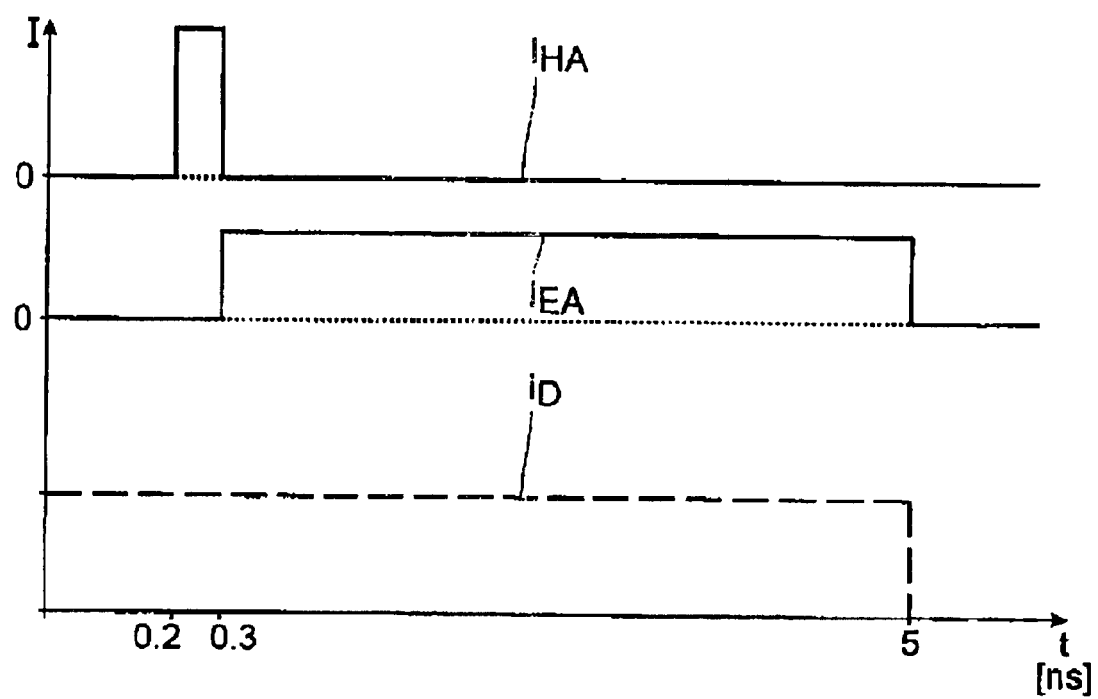
FIG. 8 is a timing diagram for the various currents flowing through and by a memory cell in a writing operation.

FIG. 8 shows a schematic timing diagram for an examplary process of switching the magnetic moment of a ferromagnetic soft layer in a memory cell, in which the different currents used in the switching process are depicted against time. In total, the switching process takes between 0.2 and 5 ns.

At the beginning of the switching process a current ($I_{HA}$) generating a hard axis field, i.e., a magnetic field in alignment with the direction of the hard axis of the ferromagnetic soft layer, is passed by the memory cell through an appropriate one of the word and the bit line. As the hard axis is perpendicular to the soft axis of magnetisation, the magnetic moment of the ferromagnetic soft layer is substantially rotated out of its previous alignment with the easy axis towards an alignment with the hard axis.

A fast rising current Impulse $I_{HA}$ which generates a field approximately twice as strong as the coercive field of the ferromagnetic soft layer is switched off, when the magnetic moment of the ferromagnetic soft layer is rotated in plane by approximately 45 to 135 degrees away from its original position. If such a strong current impulse is applied for longer times, i.e. at least for the time it takes to carry out a 180 degree rotation for the magnetic moments of the ferromagnetic soft layer array wide selectivity is lost which is known as the quasi ballistic time limit for magnetization reversal and of the order of 150 ps for a thin NiFe layer. An alternative would be to apply a weaker current impulse $I_{HA}$ for a longer time that is unable to switch the ferromagnetic soft layer no matter how long the impulse is applied. In addition a much weaker current $I_{EA}$ may be passed by the memory cell generating an easy axis field, i.e. a magnetic field in alignment with the direction of the easy axis of the ferromagnetic soft layer. The magnetic field generated by current $I_{EA}$ tends to rotate the magnetic moment of the ferromagnetic soft layer into alignment with the easy axis of the layer. Depending on the direction of the current $I_{EA}$, the alignment is either rotated towards a parallel or an anti-parallel state with respect to the easy axis and, as a consequence, with respect to the magnetic moment of the ferromagnetic fixed layer. One of both states represents a logical "0" while the other represents a logical "1".

At any time during the switching sequence, i.e., during the flow of current $I_{HA}$ or current $I_{EA}$, a direct current $I_D$ is led through the memory cell to effect the switching of the magnetic moment of the ferromagnetic soft layer into the desired orientation. That is, while $I_{HA}$ serves to disturb the previous alignment at the beginning of the switching sequence, $I_{EA}$ and $I_D$ together will effect the switching into the desired new orientation of the magnetic moment.

The current $I_{EA}$ and the direct current 10 may be set back to zero any time between 0.2 and 5 ns after initiating the switching process, i.e. initiating the direct current and the current $I_{HA}$. There ought to be some temporal overlap between 10 or $I_{EA}$, respectively, and $I_{HA}$.

Figure 9:
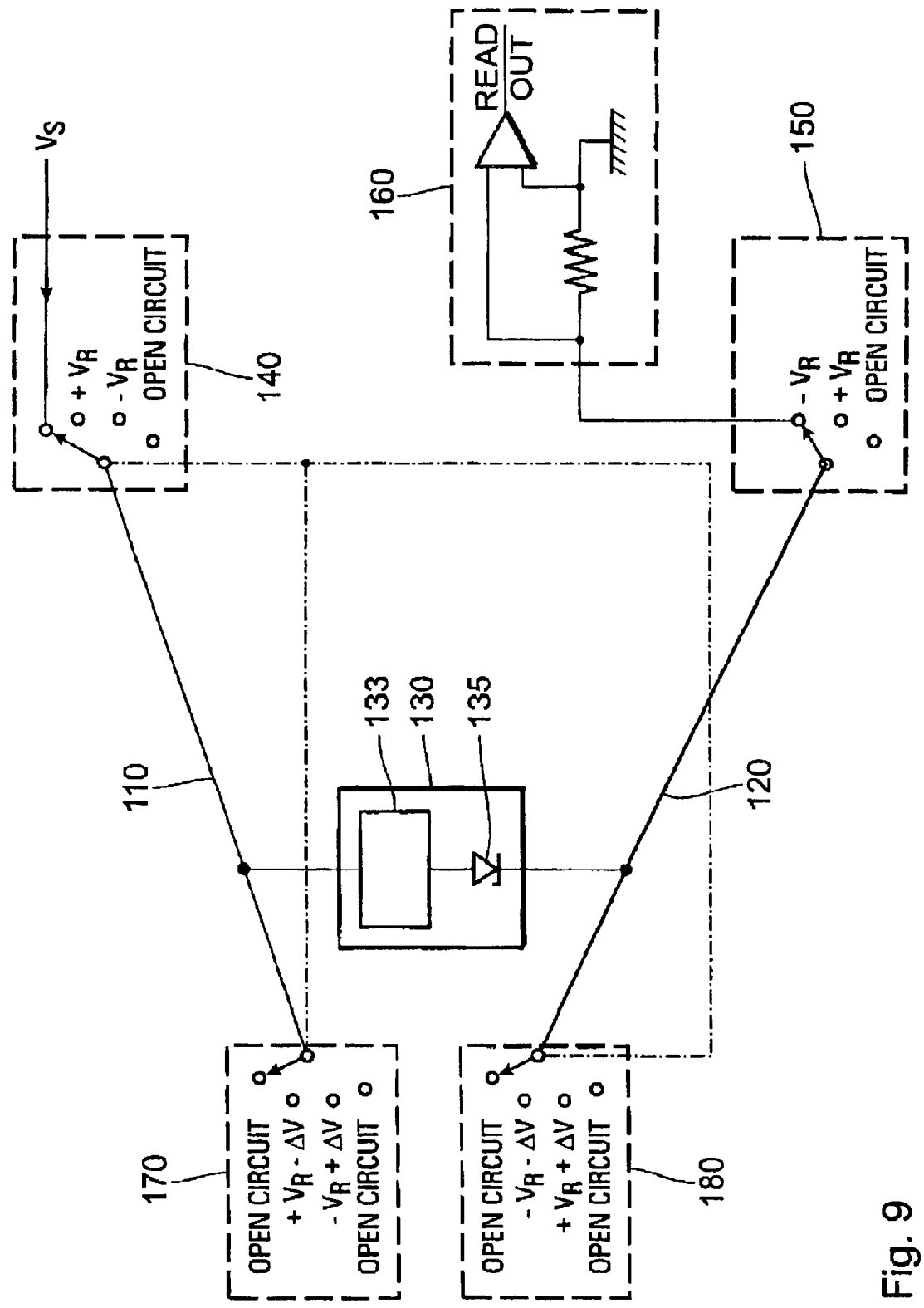
FIG. 9 shows schematically a circuit diagram which can be used to perform the writing operation.

A circuit for performing the switching described with respect to FIG. 8 is shown in FIG. 9. The circuit comprises at least one bit line 110 and a at least one word line 120 which cross at the location of a memory cell 130 which is connect between the bit line and the word line. The memory cell, which may be anyone of the memory cells described with respect to FIGS. 1–5, comprises a GMR cell section 133 and a current selection element, here depicted as Zener-diode 135. At one end of the bit line, a bit line switch 140 is provided and at one end of the word line, a word line switch 150 is provided. The bit line switch 140 allows for selecting between a read voltage (also called sensing voltage) Vs, a positive write voltage $+V_R$, a negative write voltage $-YR$, or an open circuit to be applied to the bit line 110, while the word line switch 150 allows for selecting between a negative write voltage $-V_R$, a positive write voltage $+V_R$, a read out circuit, or an open circuit to be applied to the word fine 120.

Figure 7:
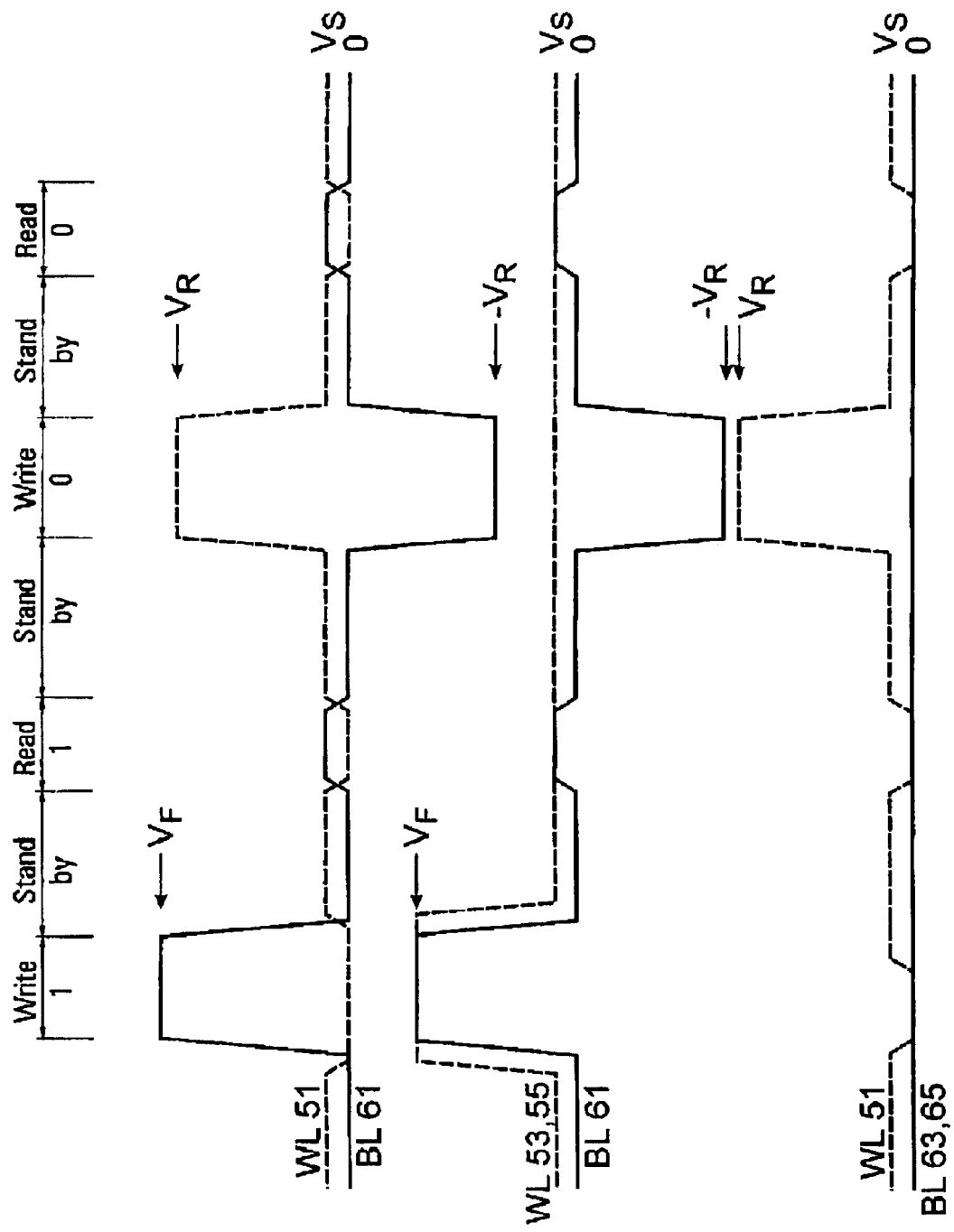
FIG. 7 illustrates the voltage levels on the leads in an memory cell array of a magnetic memory according to the invention

With the described circuit, the operations described with respect to FIG. 7 can be performed by setting the bit line switch and the word line switch to the respective voltages. The voltages $+V_F$, and $-V_F$ which have been used in the above description may be the same as $+V_R$ and $-V_R$, respectively.

As an option, the circuit shown in FIG. 9 may in addition comprise a second bit line switch 170 and a second word fine switch 180. The second switches are provided at the ends of the lines which are opposite to the ends at which the switches 140 and 160 are provided. They are used if the direct switching shall be supported by currents passing by the memory cell. Therefore, the second bit line switch 170 allows for switching between a voltage $+V_R$–fl V, a voltage $-V_R$+flY, and an open circuit, while the second word line switch 180 allows for switching between a voltage $-V_R$–ΔR, a voltage $+V_R$+ΔR, and an open circuit, where ΔR denotes a differential voltage which is small with respect to $V_R$. With the second bit line switch and the second word line switch, voltage gradients across the word line and across the bit line may, in addition to the voltage drop across the memory cell, be generated. These voltage gradients cause the currents 'HA and IEA, which have been described with respect to FIG. 8, to flow.

Next, a design for providing a flux closure in the memory cell array of the inventive magnetic memory cell will be described with respect to FIGS. 10–14.

As already mentioned, in an MRAM memory cell the information is stored in terms of parallel and anti-parallel orientation of the magnetic moment of a ferromagnetic soft layer with respect to the magnetic moment of a ferromagnetic fixed layer. When the memory cell is read, i.e., a read voltage is applied across the memory cell, the resistance of the memory cell is lower if both magnetic moments are aligned in parallel orientation and higher if both magnetic moments are aligned in anti-parallel orientation. Therefore, with the read voltage applied across the memory cell, different currents flowing through the cell are sensed in dependence of the information stored In the cell.

However, magnetic fields emerging from neighbouring MRAM memory cells, in particular magnetic stray fields from word and bit fines and neighbouring ferromagnetic hard and soft layers, influence the switching of the ferromagnetic soft layer In the memory cell. If such stray fields are oriented different than the magnetic moment of the ferromagnetic fixed layer to which the ferromagnetic soft layer is aligned, those stray fields could induce domains in the ferromagnetic soft layer which have an orientation which is not in the correct alignment with the ferromagnetic fixed layer. Such domains usually occur in the lateral periphery of the ferromagnetic soft layer, in particular at the corners of the layer and change its coercivity. Therefore, stray fields impair on the switching as they may lead to strong and arbitrary variations in the switching characteristics of the memory cell array.

To, address the problem of the ferromagnetic domains in the soft layer as well as the problem of the strong variations in the switching characteristics, various designs of memory cells have been proposed. For example, it has been proposed to give the memory cells an oval shape or a rectangular shape with tapered edges. However, these designs reduce the usable lateral size of the memory cells which negatively effects the integration level of a memory cell array.

Therefore, the present invention proposes a design for a memory cell array in which the formation of domains can be suppressed without negatively effecting the integration level of the memory cell array.

This objective is achieved by providing flux return structure for closing the flux of the ferromagnetic fixed layers along one dimension and flux closure of the bit and/or write line and ferromagnetic soft layer along a second dimension of MRAM cells, in particular magnetic memory cells as described with respect to FIGS. 1 to 8.

Figure 10:
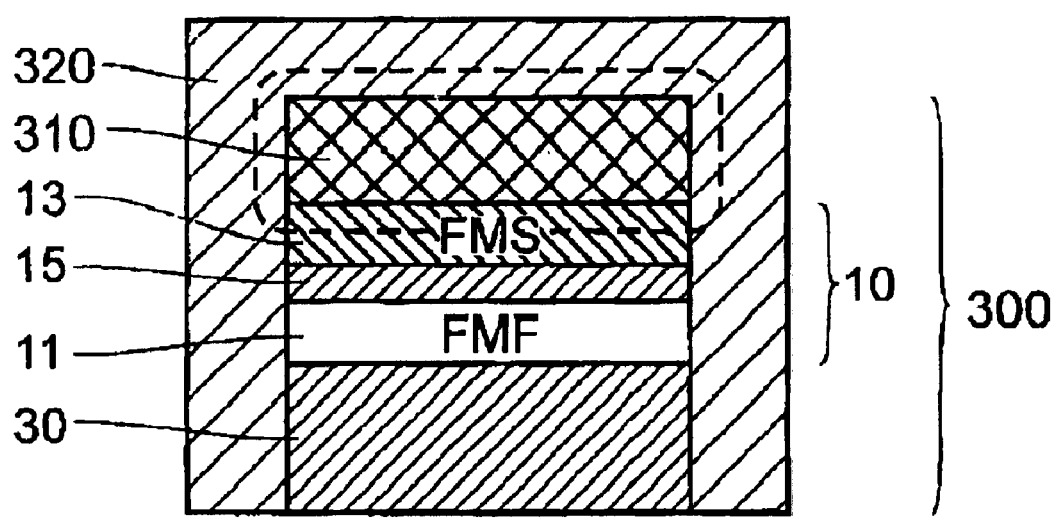
FIG. 10 shows a first embodiment of a memory cell array of an inventive magnetic memory including a flux closure.

A first design providing a flux closure for the bit and/or write line and ferromagnetic soft layer is shown in FIG. 10 along a first dimension. In FIG. 10 a cross section of the inventive memory cell 300 is made of a current control section 30 and a GMR cell section 10. In addition, a bit line 310 is connected to the GMR cell section 10 and an optional insulating layer (not shown) is provided on top. The memory cell 300 is coated with an insulating magnetic material such as a soft ferrite to allow the flux of the ferromagnetic soft layer 13 in the GMR cell section 10 and the bit line 310 to close during a write process. Alternatively, a thin insulating coating can be provided which is than covered with a soft magnetic metal film such as NiFe (not shown).

Figure 11:
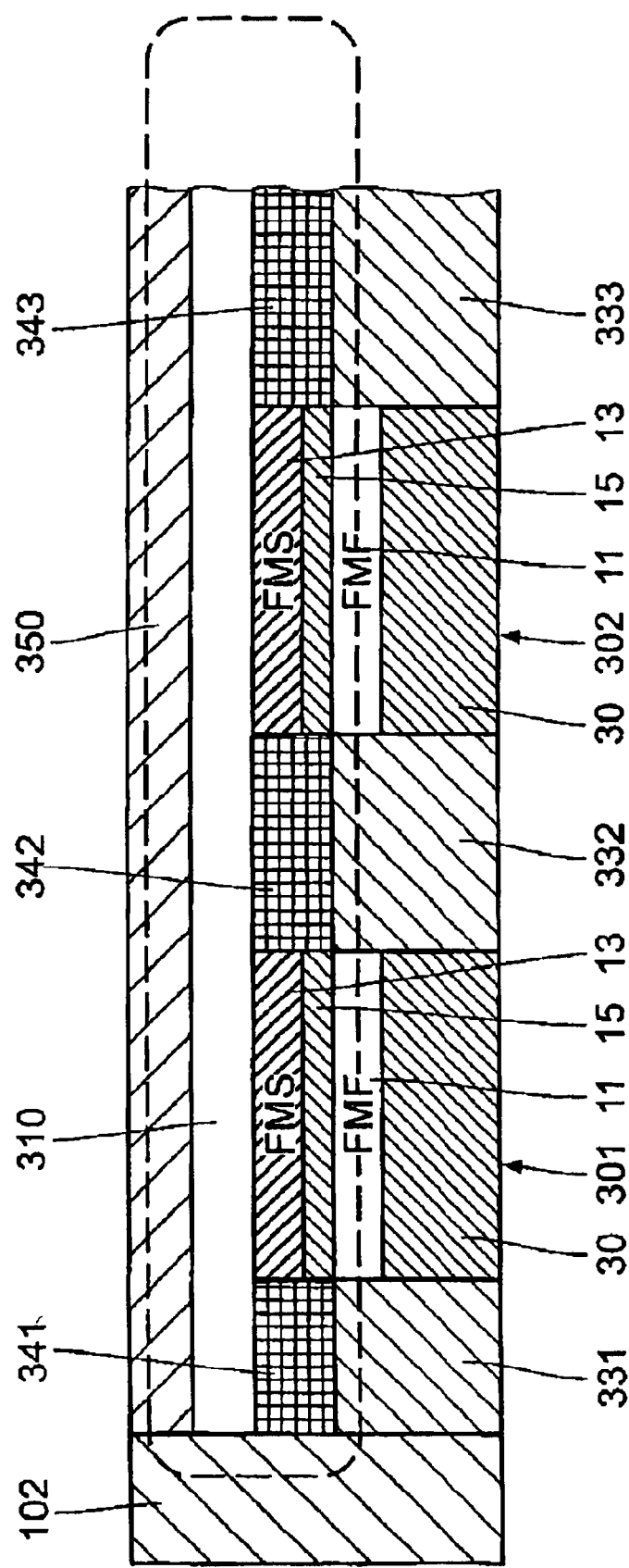
FIG. 11 shows a second embodiment of a memory cell array of an inventive magnetic memory including a flux closure.

A second design providing a flux closure for the ferromagnetic hard layer is shown in FIG. 11 along a second dimension. In FIG. 11 cross sections of memory cells 301 and 302 are provided containing a current control section 30, a GMR cell section 10, a bit line 310 connected to the GMR cell sections 10 and an optional insulating layer (not shown) provided on top. The memory cells are electrically separated from each other by insulating soft magnetic layers 331, 332 and 333 which may be for example of a soft ferrite and insulating non-magnetic layers 341, 342 and 343 which may be for example of A1203. A simplification to the design can be made when using instead of a nonmagnetic insulating material the same magnetic material as for layers 331, 332 and 333. At both ends of each row a keeper layer 102 is introduced (shown only for one end). The top insulating soft magnetic layer 350 completes the flux closure for the ferromagnetic fixed layer 11 in memory cells 301 and 302. This means that the orientation of the magnetic moment of the ferromagnetic fixed layer 11 is the same in all memory cells belonging to a row. Alternatively, instead of using an insulating soft magnetic material, a thin insulating coating can be provided which is than covered with a soft magnetic metal film such as NiFe (not shown).

Figure 12:
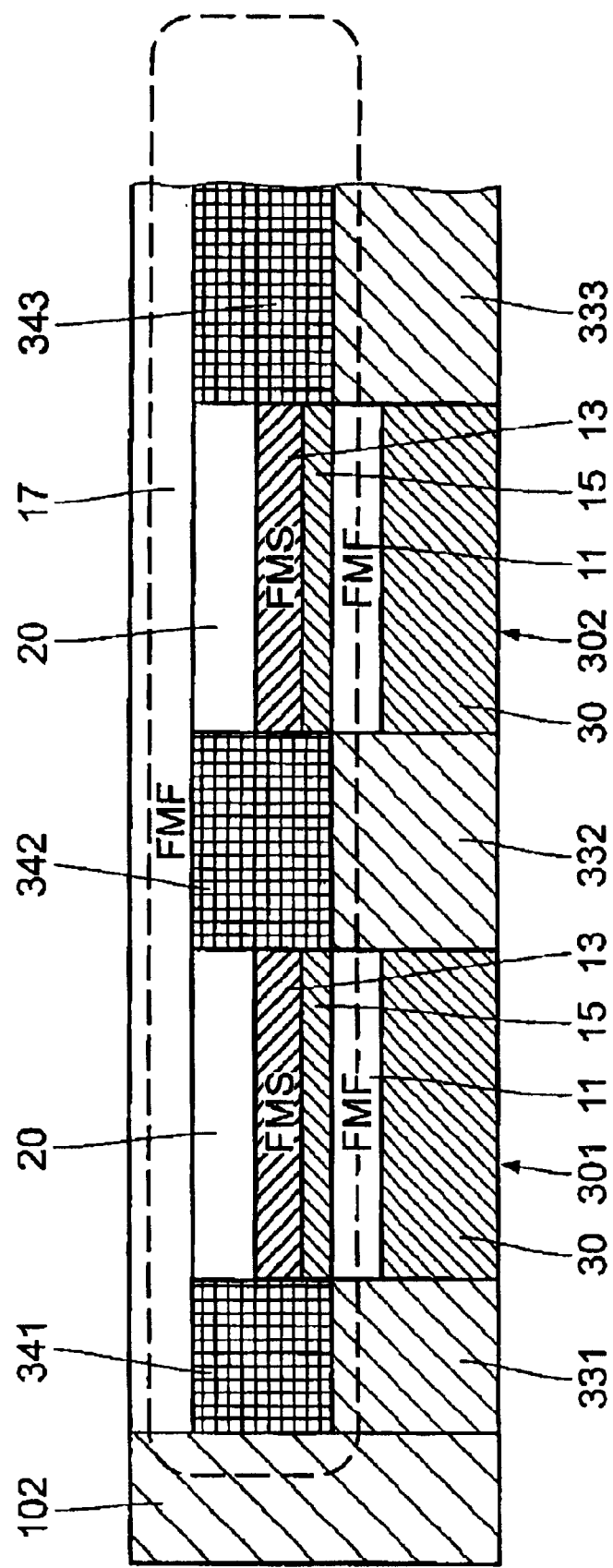
FIG. 12 shows a third embodiment of a memory cell array of an inventive magnetic memory including a flux closure.

When the memory cell contains a ferromagnetic back layer as described with reference to FIG. 12, the ferromagnetic back layer 17 can be used as a means of providing a flux closure for the ferromagnetic fixed layer 11. All memory cells in the row share the same back layer 17 that therefore extends along the whole row of memory cells. As in FIG. 11, the memory cells are electrically separated from each other by insulating soft magnetic layers 331, 332 and 333 and insulating non-magnetic layers 341, 342 and 343. At both ends of each row a keeper layer 102 is introduced (shown only for one end). For the mentioned layers the same properties as described before apply as well.

Figure 13:
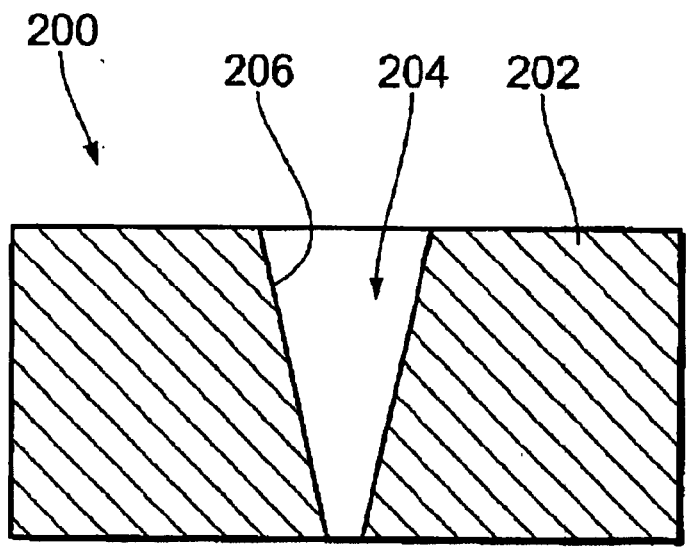
FIG. 13 shows a cross sectional view of an alternative memory cell design providing flux closure.
Figure 14:
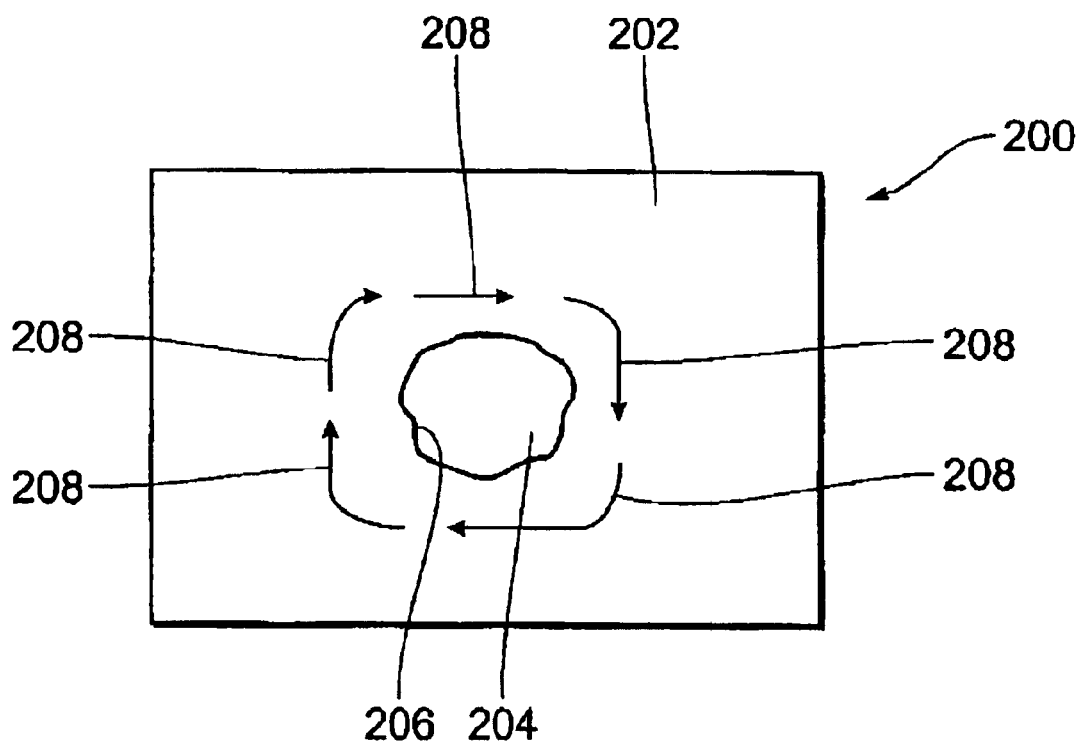
FIG. 14 shows a top view of the memory cell of FIG. 13.

FIGS. 13 and 14 show an alternative embodiment providing flux closure in a memory cell 200 that does not require an incorporation of specially designed structures in a memory cell array. FIG. 13 is a schematic cross-sectional view of the memory cell 200. No detailed layer structure of the memory cell is shown in FIG. 13 for reasons of simplicity only. The actual layer structure used can be according to any of the previous embodiments of memory cells. FIG. 14 is a schematic top view of the memory cell 200.

The present embodiment is based on the idea that the logical states "0" and "1" can also be represented by a clockwise and anti clockwise circular ordering, respectively, of the magnetic moments within a layer. This is made possible by fabricating the memory cell 200 with an opening 204 approximately in the lateral centre of the cell body 202. The circular ordering is energetically favourable over a parallel ordering in the presence of opening 202. The opening prevents the magnetic moments from arranging parallel to each other in the layer. Therefore, the flux will always be oriented parallel to the respective edges of the cell and does not reach beyond the cell into a neighbouring cell.

The lateral shape of the memory cell 200 may be rectangular, circular or slightly elliptical.

The opening 204 is of approximately circular lateral shape as seen in the top view of FIG. 14. This slightly irregular shape of the opening and the side walls 206 is owed to the method of fabricating the opening, which may for instance be an ion milling process. However, a regular shape may of course also be used, using, for instance a laterally limited etching process using an etching mask in a way known well in semiconductor device technology. Other shapes of the opening, like rectangular or quadratical, work as well, but are more complicated to produce.

The opening 204 may be of cylindrical shape. However, as shown in FIG. 13, the opening can have the shape of a truncated cone to simplify the fabrication of the opening. The circular ordering of magnetic moments in the magnetic layers is shown by arrows 208 for the example of a clockwise ordering.

What is claimed is:

1. A magnetic memory cell comprising:
    a first layer or stack of two or more conductive layers having at least one first magnetic layer with a first magnetic moment;
    a second layer or stack of two or more conductive layers having least one second magnetic layer with a second magnetic moment;
    a third layer or stack of two or more non-magnetic layers, that is arranged between and contacting said first layer or stack and said second layer or stack and allows a non-tunneling current to pass,
    a current control element allowing a current of up to at least a predetermined writing current amount to pass across the cell in a first direction perpendicular to the layer planes of the layers or stacks, and prohibiting a current to pass across the cell in a second direction opposite to said first direction, unless the current amount in the second direction is higher than a predetermined reading current amount, which reading current amount is lower than said writing amount,
    wherein extensions of said layers or stacks in a direction perpendicular to the layer planes of the layers or stacks, as well as the materials of said layers or stacks are adapted to allow a change of an orientation of said first and second magnetic moments relative to each other with the aid of a current of at least said writing current amount, and to influence a current amount across the cell of at most said reading current amount by a giant magnetoresistance effect.

2. The magnetic memory cell according to claim 1, wherein the extension perpendicular to the layer plane of at least one layer of said third layer or stack and/or the material of at least one layer of said third layer or stack is such as to prevent permanent coupling of the orientations of said first and second magnetic moments.

3. The magnetic memory cell according to claim 2, wherein said first, second and third layer or stacks are arranged and designed such that said first and second magnetic moments show a parallel or anti-parallel alignment relative to each other, and such that an orientation of said alignment is changeable by sending a current of at least said writing current amount across the device in said first or second direction, respectively.

4. The magnetic memory cell according to claim 3, wherein said at least one first magnetic layer is a ferromagnetic fixed layer and said at least one second magnetic layer is a ferromagnetic soft layer.

5. The magnetic memory cell according to claim 4, wherein the extension of said at least one second magnetic layer perpendicular to the layer plane is less than 5 atomic layers.

6. The magnetic memory cell according to claim 1, wherein the thickness and/or the material of said first layer or stack is chosen such that electrons passed through the layer or stack are spin polarised and wherein the thickness and/or the material of said third layer or stack is chosen such that the polarisation is still detectable at the location of the second layer or stack.

7. The magnetic memory cell according to claim 6, wherein the thickness of said third layer or stack is in the range of 3 to 20 nm.

8. The magnetic memory cell according to claim 1, comprising a fourth layer or stack of layers and a fifth layer or stack of layers, wherein the first and third layers or stacks are arranged on a first side of said second layer or stack, and said fourth and fifth layers or stacks are arranged on a second side of said second stack opposite to said first side, wherein the fourth layer or stack has one or more conductive layers which comprises at least one third magnetic layer having a third magnetic moment aligned anti-parallel to said first magnetic moment, and wherein the fifth layer or stack has one or more non-magnetic layers separating said fourth layer or stack from said second layer or stack and allowing a current to pass.

9. The magnetic memory cell according to claim 8, wherein the extension of at least one layer of said fifth layer or stack perpendicular to the layer plane and/or the material of at least one layer of said fifth layer or stack is such as to prevent coupling of the orientations of said third and second magnetic moments.

10. The magnetic memory cell according to claim 9, wherein the extension of at least one layer of said fourth layer or stack perpendicular to the layer plane and/or the material of at least one of the layers of said fourth layer or stack is such that electrons reflected from the layer or stack are polarised, and wherein the extension of at least one layer of said fifth layer or stack perpendicular to the layer plane and/or the material of at least one layer of said fifth layer or stack is chosen such that the polarisation is still recognisable at the location of the second layer or stack.

11. The magnetic memory call according to claim 10, wherein the thickness of said fifth layer or stack is in the order of the spin-diffusion length of the material from which the fifth layer or stack is made.

12. The magnetic memory cell according to claim 10, wherein said fifth layer or stack is made of a semiconducting material with a thickness of at least a few monolayers.

13. The magnetic memory cell according to claim 10, wherein the fifth layer or stack is formed of a thin layer with a long spin diffusion length of at least a few monolayers thickness adjacent to said second layer or stack followed by a layer with a short diffusion length and a thickness of the same order as its spin diffusion length.

14. A magnetic memory cell, wherein at least two magnetic memory cells according to claim 1 are provided, which are separated from each other by a separation layer or stack.

15. The magnetic memory cell according to claim 1, wherein said current control element is a Zener-diode.

16. The magnetic memory cell according to claim 1, comprising an opening traversing all magnetic layers.

17. A magnetic memory comprising an array of magnetic memory cells according to claim 1.

18. The magnetic memory according to claim 17, comprising a flux return structure adapted to close the magnetic flux of a number of memory cells.

19. The magnetic memory according to claim 18, wherein a flux closure along the hard axis direction is provided by a keeper layer around two sides and on top of each memory cell.

20. The magnetic memory according to claim 19, wherein, in a row of memory cells, magnetic layers electrically separate the memory cells of the row, a keeper layer is provided at both ends of the row, and a top magnetic layer is provided on top of the row of memory cells.

21. The magnetic memory cell according to claim 20, wherein the top magnetic layer is formed by a fourth layer or stack, said fourth layer or stack arranged on a one side of said second layer or stack, wherein the fourth layer or stack has one or more conductive layers which comprises at least one third magnetic layer having a third magnetic moment aligned anti-parallel to said first magnetic moment.

22. The magnetic memory according to claim 20, wherein said top magnetic layer is a common layer for all memory cells arranged in a row.

23. A method of writing a memory cell in which data is stored in a magnetic storage layer having a magnetic moment, comprising the steps of:
   causing a flow of charge carriers through the memory cell by applying a voltage across the memory cell;
   spin polarising the charge carriers by passing them through a magnetic layer having a magnetic moment with a defined orientation; and
   passing the spin polarised charge carriers through the magnetic storage layer and writing said magnetic storage layer with the aid of the interaction of the polarised charge carriers with said magnetic moment of said magnetic storage layer;
   wherein said method comprises at least one step of passing an support current ($I_{HA}$) by the location of the memory cell, said additional current generating a magnetic field that is adapted to support writing of the magnetic storage layer.

24. The method according to claim 23, wherein said support current comprises a current pulse being adapted to generate a hard-axis field in the magnetic layer of the second stack for a predeterimed time span.

25. The method according to claim 24, wherein the current amount of said current pulse is adapted to create a magnetic filed lower than the coercive field of the storage layer.

26. The method according to claim 24, wherein the current amount of said current pulse is adapted to create a magnetic filed higher than the coercive field of the storage layer and the time span is short enough not to write the magnetic storage layer by the current pulse alone.

27. The method according to claim 23, wherein an orientation of the charge carrier's spin polarisation is chosen by choosing the direction of the flow of said charge carriers through said magnetic layer.

28. The method according to claim 23, wherein the spin polarisation of the charge carriers at the location of the magnetic storage layer is enhanced by passing the charge carriers through a first polarisation layer before passing them through the magnetic storage layer, and by passing the charge carriers through a second polarisation layer after passing them through the magnetic storage layer, said second polarisation layer having a magnetic moment anti-parallel to that of the first polarisation layer.

29. A memory circuit for writing a magnetic memory cell, comprising:
- at least one bit line,
- at least one word line crossing the bit line, and
- at least one memory cell (130) located at the crossing of the bit line and the word line and being connected between the bit line and the word line,
- wherein a bit line controller is connected to the bit line and a word line controller is connected to the word line,
- wherein the bit line controller provides at least a switching state for applying a sensing voltage $V_s$, a switching state for applying a positive reference voltage, and a switching state for applying negative reference voltage to the bit line, and
- wherein the word line controller provides at least a switching state for connecting a read out circuit, a switching state for applying the positive reference voltage, and a switching state for applying the negative reference voltage to the word line.

30. The memory circuit according to claim 29, in which the bit line controller and the word line controller each provide a switching state which provides an open circuit state of the respective one of the bit line and the word line.

31. The memory circuit according to claim 29, wherein a second bit line controller is connected to the bit line and a second word line controller is connected to the word line, and
- wherein the second bit line switching means provides a switching state for applying a second positive voltage which is less positive than the positive reference voltage by the amount of a difference voltage to the bit line, and a switching state for applying a second negative voltage which is less negative than the negative reference voltage by the amount of said difference voltage to the bit line, and the second word line switching means provides a switching state for applying a third positive voltage which is more positive than the positive reference voltage by the amount of said difference voltage to the word line, and a switching state for applying a third negative voltage which is more negative than the negative reference voltage by the amount of said difference voltage to the word line.

32. The memory circuit according to claim 31, in which the second bit line controller and the second word line controller each provide a switching state which provides an open circuit of the respective one of the bit line and the word line.

* * * * *